United States Patent
Soo Hoo et al.

(10) Patent No.: US 9,313,935 B2
(45) Date of Patent: Apr. 12, 2016

(54) UNIVERSAL/PORTABLE CABLE SUPPORT AND EMI REDUCTION BAR

(71) Applicant: International Business Machines Corporation, Armonk, NY (US)

(72) Inventors: Kwok M Soo Hoo, Poughkeepsie, NY (US); Alma Jaze, Poughkeepsie, NY (US); Simon Mathew, Middletown, NY (US); Arkadiy O Tsfasman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 14/248,382

(22) Filed: Apr. 9, 2014

(65) Prior Publication Data

US 2015/0296666 A1 Oct. 15, 2015

(51) Int. Cl.
*H05K 9/00* (2006.01)
*H05K 7/14* (2006.01)

(52) U.S. Cl.
CPC ............ *H05K 9/0062* (2013.01); *H05K 7/1491* (2013.01)

(58) Field of Classification Search
USPC ............ 361/796, 679.01, 748, 784, 752, 825, 361/826, 799, 816, 818; 439/928.1; 174/35 R, 50, 51
See application file for complete search history.

(56) References Cited

U.S. PATENT DOCUMENTS

| | | | |
|---|---|---|---|
| 2,404,531 A * | 7/1946 | Robertson | 248/68.1 |
| 3,830,954 A | 8/1974 | Caudill | |
| 4,764,422 A * | 8/1988 | Hill et al. | 428/309.9 |
| 5,122,068 A | 6/1992 | Koss | |
| 5,713,748 A * | 2/1998 | Mulvihill | 439/98 |
| 5,834,693 A | 11/1998 | Waddell et al. | |
| 6,142,829 A | 11/2000 | O'Groske et al. | |
| 6,309,037 B2 | 10/2001 | Bertolami | |
| 6,469,244 B1 | 10/2002 | Harrison et al. | |
| 6,623,303 B2 | 9/2003 | Syed et al. | |
| 6,791,841 B1 | 9/2004 | Tirrell et al. | |
| 6,890,191 B1 | 5/2005 | Thorburn | |
| 6,970,361 B2 * | 11/2005 | Jansen | 361/759 |
| 7,029,315 B2 | 4/2006 | Dang | |
| 8,243,470 B2 | 8/2012 | Jaze et al. | |
| 8,616,506 B2 * | 12/2013 | Milton | 248/74.1 |
| 2006/0034026 A1 * | 2/2006 | Chiku et al. | 361/85 |
| 2009/0283318 A1 | 11/2009 | Bonga et al. | |
| 2012/0205134 A1 | 8/2012 | Brasier et al. | |

* cited by examiner

*Primary Examiner* — Hung S Bui
(74) *Attorney, Agent, or Firm* — Steven Chiu

(57) ABSTRACT

A Universal/Portable Cable Support and EMI Reduction Bar which to attenuate electromagnetic interference on the input/output cables of the electronics rack passing therethrough before the cables exit the rack. The bar works for cables exiting any part of the rack. The design involves an introduction of a grounding bar that can serve as EMI suppression (detuning frame resonance and reducing cable emissions) as well as cable support/retention functions. The bar provides a stable Ethernet cable support and EMI (Electromagnetic Interference) suppression structure which reduces EMI emission on the cable as well as eliminates the extra connection needed when using a separate RF (Radio Frequency) choke. A device, system and method are provided.

17 Claims, 7 Drawing Sheets

UNIVERSAL/PORTABLE CABLE SUPPORT AND EMI REDUCTION BAR

BACKGROUND

High end computing systems may be implemented in both raised floor and non-raised floor installations. Users who do not have raised floor computer room installations may want to route cables (copper and fiber optic) overhead through the top of the system to the ceiling cable troughs/raceways and to adjacent frames while mitigating electromagnetic interference (EMI).

SUMMARY

In one aspect, a device for cable support and electromagnetic interference (EMI) reduction in an electronics rack is provided. The device includes: a cable support bar having at least one opening for at least one cable of the electronics rack to pass therethrough, the cable support bar having a first end and a second end and formed by joining a top section half and a bottom section half, the rack having a first side wall and a second side wall; the top section half of the bar having at least one top channel and the bottom section half of the bar having at least one bottom channel, wherein ferrite inductor portions are dispersed within and around at least one top channel and at least one bottom channel.

The bar has a first attachment mechanism to attach and ground the first end of the bar to the first side of the rack; and a second attachment mechanism to attach and ground the second end of the bar to the second side of the rack.

The top and bottom section halves of the bar are disposed so that when the top section is attached to the bottom section, the top section and bottom section thereby form an attached structure with the channels aligned to create the opening through which at least one cable may pass. The attached structure applies force to the ferrite inductor portions to ensure that the top ferrite inductor portion and the bottom ferrite inductor portion make physical contact thereby forming an electromagnetic inductor around a cable passing through the opening.

In another aspect, an electronics system is provided. The system includes an electronics rack, which includes: a rack frame; at least one electronics subsystem disposed within the electronics rack and supported by the rack frame; and a cable support and electromagnetic interference (EMI) reduction device attached to the electronics rack.

The device includes a cable support bar having at least one opening for at least one cable of the electronics rack to pass therethrough, the cable support bar having a first end and a second end and formed by joining a top section half and a bottom section half, the rack having a first side wall and a second side wall; the top section half of the bar having at least one top channel and the bottom section half of the bar having at least one bottom channel. The ferrite inductor portions are dispersed within and around at least one top channel and at least one bottom channel. The bar has a first attachment mechanism to attach and ground the first end of the bar to the first side of the rack; and a second attachment mechanism to attach and ground the second end of the bar to the second side of the rack.

The top and bottom section halves of the bar are so disposed so that when the top section is attached to the bottom section the top section and bottom section thereby form an attached structure; the channels align to create the opening through which the at least one cable may pass; and the attached structure applies force to the ferrite inductor portions to ensure that the top ferrite inductor portion and the bottom ferrite inductor portion make physical contact thereby forming an electromagnetic inductor around a cable passing through the opening.

In yet another aspect, a method of supporting and attenuating electromagnetic interference on at least one input/output cable exiting an electronics rack is provided. The method includes: providing a cable support and electromagnetic interference (EMI) reduction bar to the electronics rack, the bar having at least one opening for at least one cable of the electronics rack to pass therethrough, the cable support bar having a first end and a second end and formed by joining a top section half and a bottom section half, the rack having a first side wall and a second side wall; the top section half of the bar having at least one top channel and the bottom section half of the bar having at least one bottom channel. The method further includes providing ferrite inductor portions around the at least one top channel and the at least one bottom channel.

The top and bottom section halves of the bar are so disposed so that when the top section is attached to the bottom section the top section and bottom section thereby form an attached structure. The channels align to create the opening through which the at least one cable may pass; and the attached structure applies force to the ferrite inductor portions to ensure that the top ferrite inductor portion and the bottom ferrite inductor portion make physical contact thereby forming an electromagnetic inductor around a cable passing through the opening.

DETAILED DESCRIPTION

Figure 1:
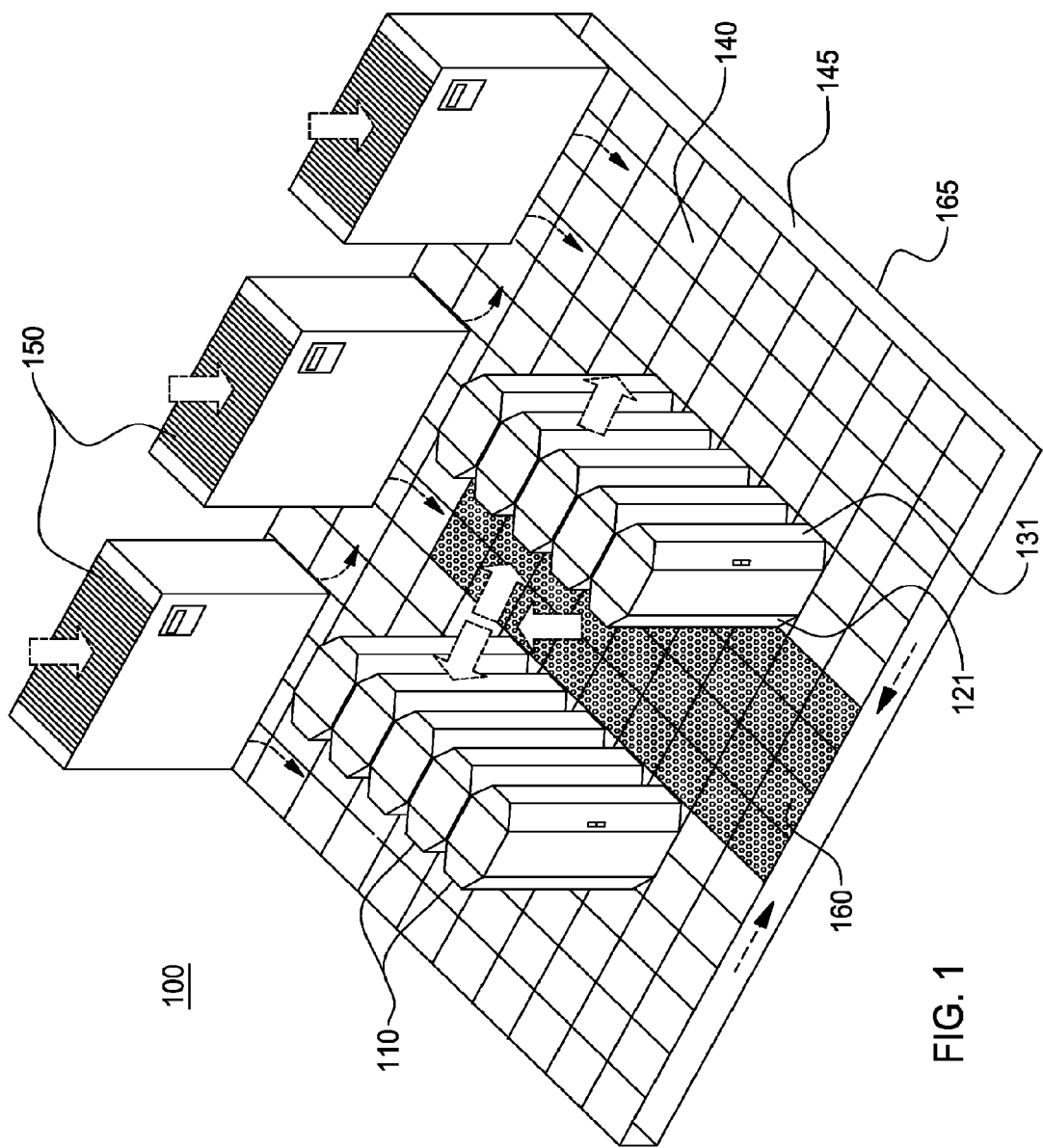
FIG. 1 depicts a conventional data center.

Server room operators may route input output "I/O" cables overhead through the top of the system to the ceiling cable troughs/raceways and to adjacent frames. Such cables are generally fiber optic and/or contain copper. Copper I/O cables radiate the internal electromagnetic interference "EMI"

energy which they either carried in the signal conductors or via electromagnetic coupling from other sources re-enforced by frame/chassis resonant frequencies. If the radiated EMI emissions from the I/O cables exceeds the Federal Communications Commission (FCC) or other countries' regulatory limits then EMI suppression fix(es) have to be applied to bring the emission level under the limits.

The direct source of the EMI may come from Ethernet adapter during data transmissions as well as induced current on the cables from internal electromagnetic field coupling from other sources such as switched mode power supplies.

As an example, in the case of Ethernet cables that exceed EMI emissions regulatory limits, some computer systems may implement the Ethernet cable radio frequency "RF" chokes for non-raised floor and over head cable offerings. The Ethernet cable RF choke involves the use of a short jumper cable with 2 turns wound on a ferrite core to complete the RF choke configuration with one end plugged into the I/O adapter card and the other end to the outbound cable connecting to the external Ethernet Hubs.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. "Cable port structure" refers to any frame, rack, bracket, housing, etc., defining an opening through which input/output cables of the electronics rack are to pass. In a bottom-mounted input/output cable port assembly embodiment such as disclosed herein, the cable port structure is disposed at the bottom or at a lower region of the electronics rack, which is particularly useful in a non-raised floor data center installation. In a top-mounted input/output cable port assembly embodiment such as disclosed herein, the cable port structure is disposed at the top or at an upper region of the electronics rack, which is particularly useful in exiting input/output cables of the electronics rack to a space above the electronics rack. As used herein, the phrase "data center" refers to a computer room installation which contains one or more electronics racks to be cooled. As a specific example, a data center may be designed to contain one or more rows of rack-mounted computing units, such as server units.

Reference is made below to the drawings, which are not drawn to scale to facilitate understanding of the invention, wherein the same reference numbers used throughout different figures designate the same or similar components.

As shown in FIG. 1, in a raised floor layout of a computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within data center 100. Room air is taken into each conditioned air unit 150 near an upper portion thereof. This room air comprises in part exhausted air from the "hot" air aisles of the data center disposed adjacent to air outlet sides of the electronics racks 110.

Electronics racks comprising high-end computing systems such as a System P® or System Z® offered by International Business Machines Corporation (IBM®), of Armonk, N.Y., comprise configurations for both raised floor and non-raised floor installations. (IBM® System P® and System Z® are registered trademarks of International Business Machines Corporation, Armonk, N.Y. Other names used herein may be registered trademarks, trademarks or product names of International Business Machines Corporation or other companies.)

Figure 2:
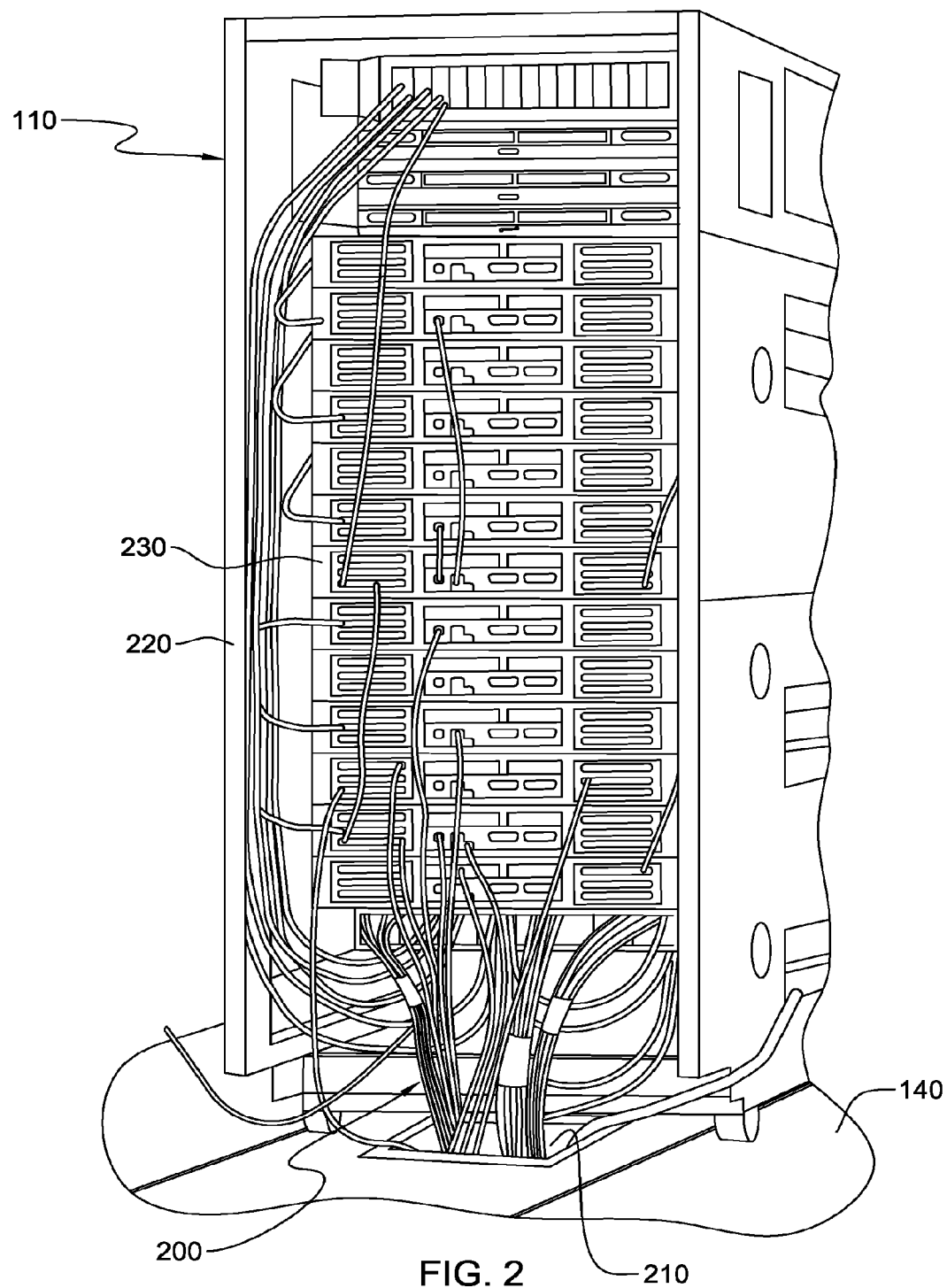
FIG. 2 depicts a conventional electronics rack disposed on the raised floor of a raised floor data center, and illustrating input/output cables extending into the space below the raised floor.

FIG. 2 illustrates a raised floor 140 installation of an electronics rack 110 wherein a plurality of input/output cables 200, such as various Ethernet cables, extend into an opening 210 in raised floor 140. Electronics rack 110 includes a rack frame 220 which supports a plurality of electronics subsystems 230 from and to which the plurality of cables 200 extend, at least some of which pass through opening 210 in raised floor 140 for coupling, for example, to one or more other electronics racks or electronics equipment within the data center. In one conventional approach, input/output cabling 200 continues under raised floor 140 through a rectangular structure with a conductive gasket that shorts out the structure and forms a capacitive coupling with the metal of the raised floor so that energy is blocked from escaping. However, in a non-raised floor environment, an alternate approach is needed for attenuating electromagnetic interference radiating from the input/output cables.

Figure 3:
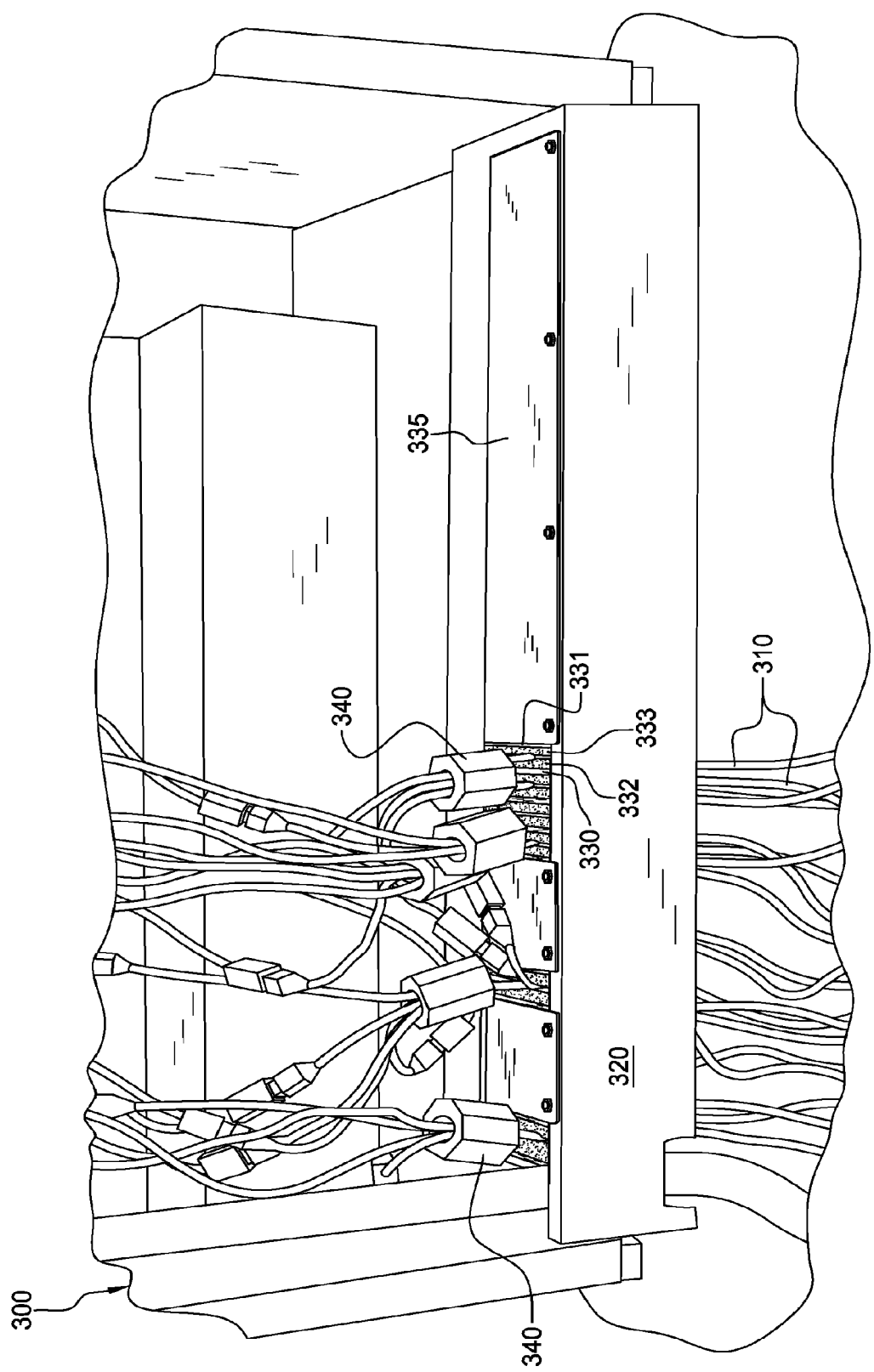
FIG. 3 is a partial perspective view of an alternate embodiment of an electronics rack with a tailgate structure through which input/output cables pass, for facilitating use of the electronics rack in a non-raised floor data center.

FIG. 3 illustrates one embodiment of a lower portion of an electronics rack 300, with an access panel removed and showing a plurality of cables 310 extending through a tailgate structure 320, wherein a plurality of adjoining, interlocked partitions 330,331 are employed with opposing compressible surfaces 332, 333 which engage one or more input/output cables 310 passing therethrough to provide relief. As illustrated, horizontally-coupled plates 335 can be used to further reduce the size of the cable opening within tailgate structure 320 to limit radiation of electromagnetic interference from the inside of the electronics rack into the data center.

Due to the large amount of input/output cables, which are typically copper-based cables, the non-raised floor installation of electronics rack with exposed input/output cables has more difficulty meeting national and international radiated electromagnetic interference emission limits.

In the illustrated embodiment of FIG. 3, ferrite cores or radio frequency (RF) chokes 340 are shown applied to the input/output cables in the interior of the electronics rack adjacent to tailgate structure 320 to reduce radiated electromagnetic interference emissions. These ferrite cores 340 are disposed before the input/output cables exit the electronics rack and may be in addition to other ferrite cores or RF chokes within the electronics rack used to reduce radiated EMI emissions at different locations within the rack. Note that application of ferrite cores 340 to the input/output cables before leaving through the tailgate structure requires the relative core location to be different for each length of input/output cable. Further, the cables may be differently rated cables, such as differently rated Ethernet cables, each with a length dependent on where the cable is to extend. The ferrite cores 340 are considered loose ferrite cores since they require installation at the customer site. In an alternate implementation, the ferrite cores could be permanently integrated with the cables via plastic molding, or some other permanent means. However, this would result in significant engineering and inventory expenses resulting from the need to produce and/or maintain a large number of cable parts.

For example, in order to satisfy all national and international standards, including the Taiwan Bureau of Standards and Meteorology Inspection (BSMI), many part numbers of the same input/output cable would be required since each one would have a ferrite core installed at a different length from the end-adapter coupled within the electronics rack. In other words, each input/output cable would need to be customized. Disclosed herein are alternative approaches which incorporate ferrite inductor designs into an input/output cable port assembly.

In one implementation, the input/output cable port assembly disclosed herein is disposed at or near the bottom of the electronics rack frame, for example, at one or both of the air inlet side and air outlet side of the electronics rack. At least two adjoining partitions of the input/output cable port assembly are fitted with one or more first ferrite inductor portions and/or one or more second ferrite inductor portions, which when the partitions are disposed adjacent to each other as adjoining partitions within the cable port structure, allow the first ferrite inductor portions and second ferrite inductor portions to mate and define a ferrite inductor with a central opening sized to allow one or more input/output cables of the electronics rack to pass therethrough. The ferrite inductor is configured to attenuate electromagnetic interference resulting from transient current on the one or more cables passing through the central opening of the ferrite inductor defined by the adjoining partitions of the input/output cable port assembly.

Advantageously, by providing ferrite inductor portions configured to mate and encircle one or more input/output cables, the need to customize input/output cables with ferrite cores or RF chokes is eliminated. In addition, multiple ferrite inductors with different ranges of suppression frequencies can be implemented by adjoining partitions as described herein below, thus yielding improved efficiency and flexibility in suppressing transient current on input/output cables passing through the ferrite inductor(s).

By way of specific example, a top-mounted input/output cable port assembly such as described below may be employed with a System P® or System Z® electronics rack, offered by International Business Machines Corporation of Armonk, N.Y.

As described above, there are typically a large number of copper-based input/output cables exiting an electronics rack. In one desired implementation, at least a portion of these cables may exit the rack at the rack's top, for example, into an overhead cable trough or ceiling space. In such an implementation, the input/output cables could inadvertently function as broadcasting antennae extending upwards from the electronics rack.

Described below is a Universal/Portable Cable Support and EMI Reduction Bar which functions to attenuate electromagnetic interference resulting from transient or steady state current on the input/output cables of the electronics rack passing therethrough before the cables exit the rack. The bar works for cables exiting any part of the rack. The design involves an introduction of a grounding bar that can serve as EMI suppression (detuning frame resonance and reducing cable emissions) as well as cable support/retention functions. The bar provides a stable Ethernet cable support and EMI (Electromagnetic Interference) suppression structure which reduces EMI emission on the cable as well as eliminates the extra connections needed when using a separate RF (Radio Frequency) choke.

The design is portable such that it can be used on different input output "I/O" drawers with cables, for example, RJ45 Ethernet, that requiring EMI suppression. RJ45 Ethernet cables are used in the following examples, but the bar may provide similar functionality for other types of cables such as power cables and I/O data transmission cables. The bars, which house ferrite cores, can be extended or contracted to fit the variability of the frame width and yet provide the grounding and EMI suppression for the copper cables. Each bar can be installed in the factory as well as retrofitted on site at server rack locations. The design further mitigates cable strain by providing physical support to the cables exiting the rack. Furthermore, using Ethernet cable applications as an example, since the design does not use RF chokes attached to the Ethernet cables, single connection or potential failure sites per cable are reduced for improved reliability. RJ45 cables used in customers' installations often have various degrees of connector latch damage due to repeated use and flimsiness of latch design. Frame level vibration along with the cable weight associated with under-floor cables sometimes can cause the cable to unseat from adapter cards which lead to outage. Utilizing the bar will also provide functional reliability for a cable due to added stability.

Each cable support bar is dedicated to one electronics rack and an electronics rack may use a single or multiple bars; the installation of the bar to the electronics rack may be through the application of pressure to the side walls by rotating the "screw threaded" ends thus extending the total length of the bar so that the bar apply sufficient pressure to the side walls to hold the bar in place when the bar is positioned between the two walls. In another embodiment, the bar may incorporate an extendable section under spring load with tension adjustment, such that the bar is compressed in order to place the bar between the two sidewalls and allowed to decompress. Magnetic end caps may also be used for attaching the bar to the side walls.

The embodiment is flexible such that it can be used on multiple I/O drawers that house Ethernet adapters and can also be retrofitted to existing system frames without modification thus providing ease of field installation.

An embodiment groups currently individual loose Ethernet cable ferrite RF chokes into a stable and organized structure which serves as a place holders for the associated cable to each Ethernet adapter card during I/O cage replacement. In other words, it provides ease of group cable removal and re-installation.

The bar may be made of any material, but metal, such as steel or aluminum is preferred since electrically grounding the bar to the side walls will provide termination for the field emitting from the Ethernet cables which offered additional level of EMI suppression. The bar may be made of plastic or non-conductive material but such a bar would lack the grounding benefit; however it would still effective as an cable support bar as well as organizer of the RF ferrite chokes; therefore both purposes of cable support and EMI suppression would still be served. The metal bar being grounded to the frame also provides termination for portion of the radiating field carried by the Ethernet cables thus reducing the escaping radiated EMI emissions when the cables are finally emerge from the system rack. A drawback of current RF choke Ethernet cable fixes is that the additional jumper translates into 2 more potential defect sites and the added weight of the ferrite core may cause the cable to unseat due to vibration jarring the cables loose over time. The bar may serve dual purposes as an EMI suppressor as well as cable retention and also eliminates a short jumper to remove 2 potential connector failure sites.

Grounding the bar to the frame provides ground termination for the electromagnetic field generated in the Ethernet cables thus reducing the overall radiated electromagnetic interference (EMI) to the outside. In addition, the design provides strain relief for the Ethernet cables addresses the problem of cable unseating because of the added weight of the RF choke implementation for EMI suppression currently in use.

In an embodiment a metal bar that houses ferrite core inside is used for cable retention as well as a radio frequency "RF" choke for the Ethernet cables. While Ethernet cables are used in the present example, the bar may support and provide RF choke functionality for other cables. The bar can be any shape and may be symmetrical or asymmetrical. The metal bar is also grounded to the sides of the frame to break up the frame level resonant frequencies for additional EMI mitigation. The metal bar being grounded to the frame also provides termination for the radiating field carried by the Ethernet cables thus reducing the escaping radiated EMI when the cables are emerging outside of the system frame.

Figure 4:
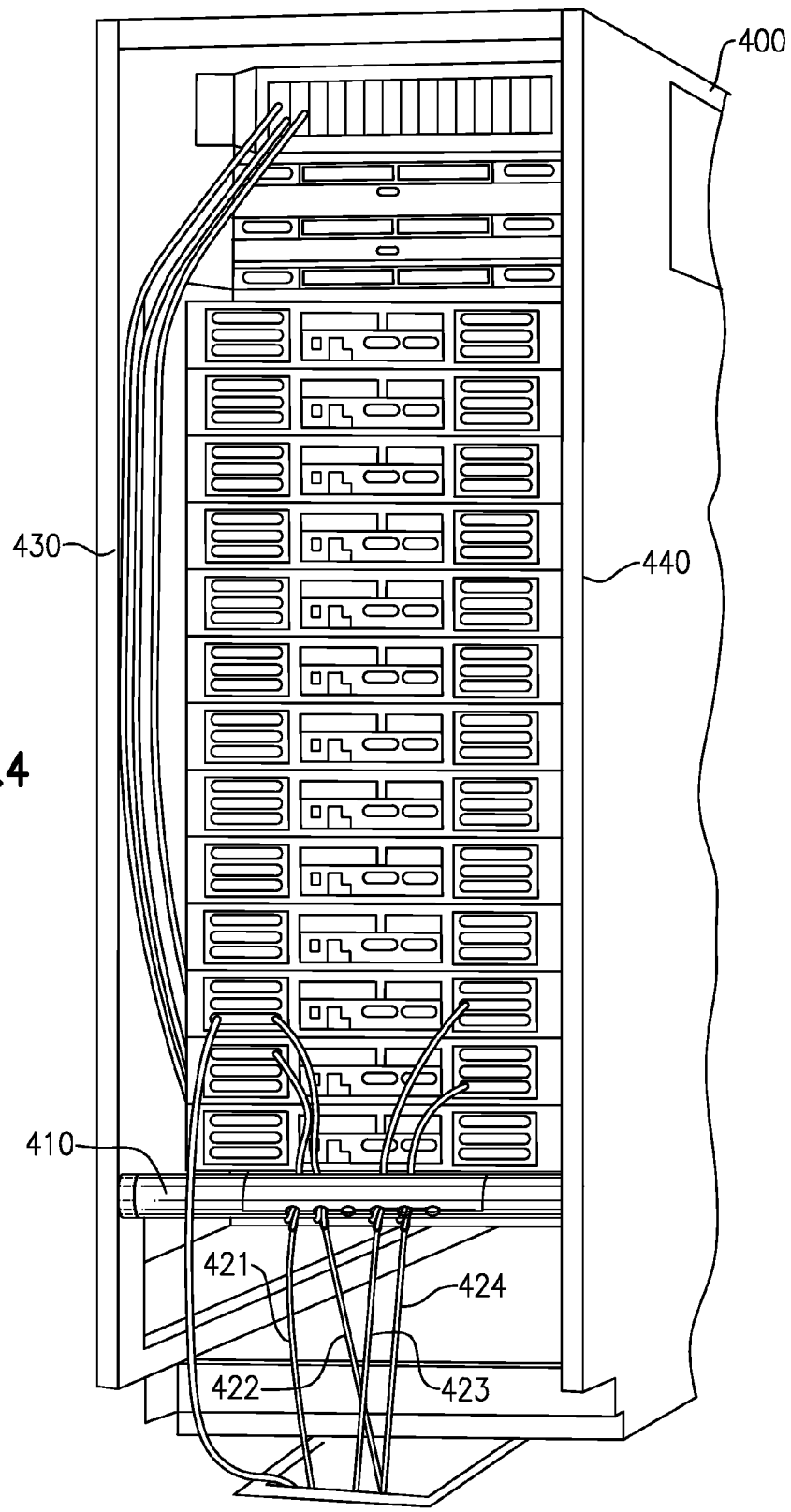
FIG. 4 depicts an embodiment installed and in use on a server rack.

FIG. 4 shows an exemplary embodiment of the invention in which the metal bar 410 supports the Ethernet cables 421-424 from the I/O drawers housed in electronics rack 400. The metal bar is attached to the walls 430 and 440 of the electronics rack. In this example, the cables exit the electronics rack in a raised floor environment, however, the cables may also exit the electronics rack, and pass through the bar towards the ceiling in the same fashion.

A section of the metal bar may be comprised of 2 complementary halves that when put together to form the bar. Ferrite inductor portions are dispersed within and around at least one top channel and at least one bottom channel.

Figure 5:
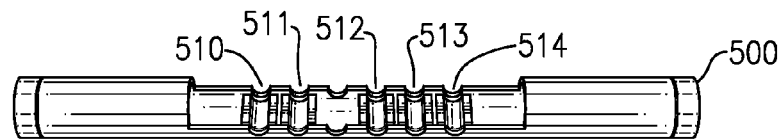
FIG. 5 depicts a bottom half of the bar with channels.

FIG. 5 shows a view of the metal bar 500 with the top complementary half section removed. As can be seen, channels 510-514 are cut into the bottom complementary half. The bar material may be cut, etched, ground or other techniques may be used to create the channel. A half section may contain one channel or multiple channels to create one or more openings in the bar.

Figure 6:
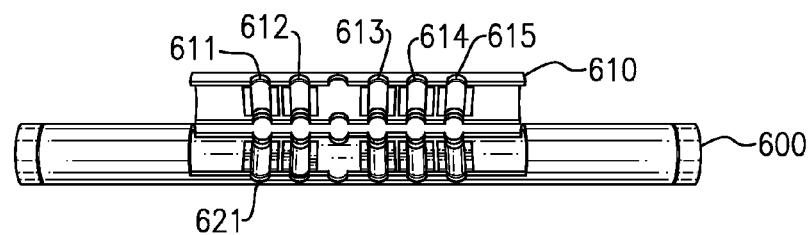
FIG. 6 depicts a bottom half section and top half section of the bar.
Figure 7:
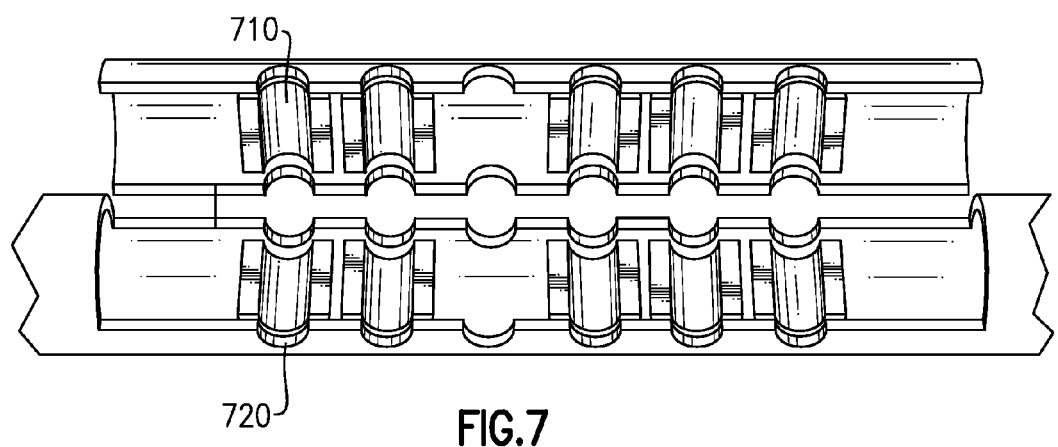
FIG. 7 depicts a close up of the top and bottom sections of the bar.

FIG. 6 shows the bottom complementary half section 600 and the top complementary half section 610. The top complementary half section 610 contains channels 611-615 disposed in such a way that when the two halves are joined, the half channels join to form an opening in the bar in which at least one cable may pass therethrough. In this example, top channel 611 lines up with bottom channel 621 and will form an opening when joined. Ferrite inductor portions may be dispersed within and around at least one top channel and at least one bottom channel FIG. 7 shows a close up view of the complementary halves and channels. Ferrite inductor portions 710 and 720 are dispersed within and around at least one top channel and at least one bottom channel.

Figure 8:
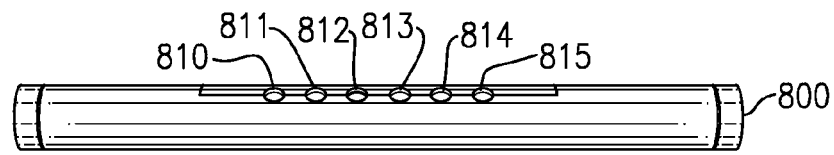
FIG. 8 depicts a bar with the two sections joined to create the openings.

FIG. 8 shows the bar 800 with the top complementary half joined to the bottom complementary half. As discussed, openings 810-815 are formed by joining the two complementary halves together.

Figure 9:
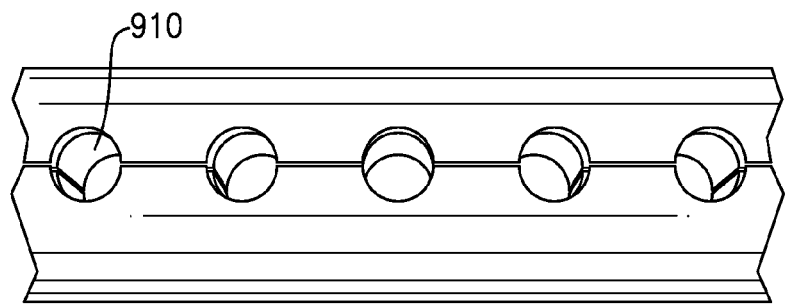
FIG. 9 depicts a close up of a section of the bar with joined halves.

FIG. 9 shows a close up of a section of the bar to demonstrate the connected halves. When the 2 halves of the bar are connected together then the ferrite core halves form an inductor around opening 910.

In another embodiment, each half of the bar contains a continuous section of ferrite in which one channel is notched out of the parent material to accommodate a cable or many cables such as Ethernet cables or the like. Multiple channels may be notched out of the parent material to house multiple cables. Such an embodiment saves space since additional ferrite is not needed, and use of a bar with continuous ferrite section increase ferrite core density per bar.

Figure 10:
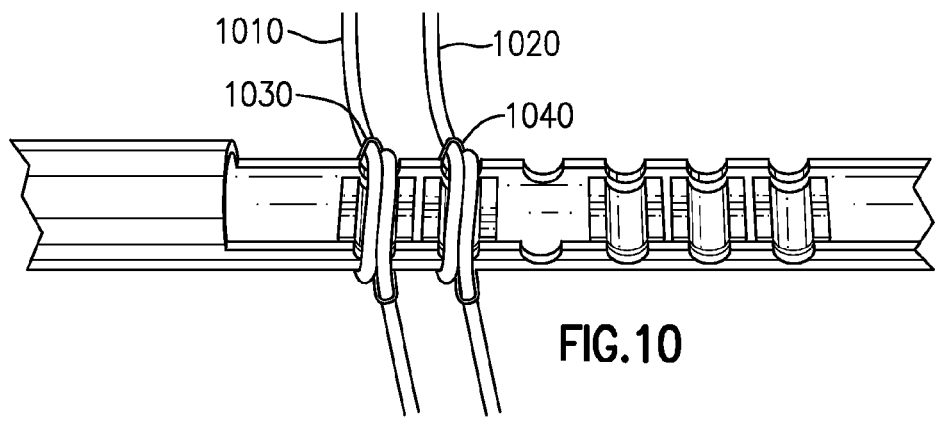
FIG. 10 depicts a bottom half section view with cables wrapped.

In this example, turning to FIG. 10, the cables 1010 and 1020 are wrapped around the half of the bar with at least two turns. Clips 1030 and 1040 are depicted and may be used to hold the cables to put the mating half bar in place. Once the 2 halves of the bar are closed the clips can be removed or left on. Since the embodiment can replace loose individual RF chokes currently in use on some current server rack offerings (non-raised floor and overhead I/O cable exits) with an organized structure, in order to function effectively as an RF choke two (2) turns through the ferrite cores are preferred for better EMI suppression.

Figure 11:
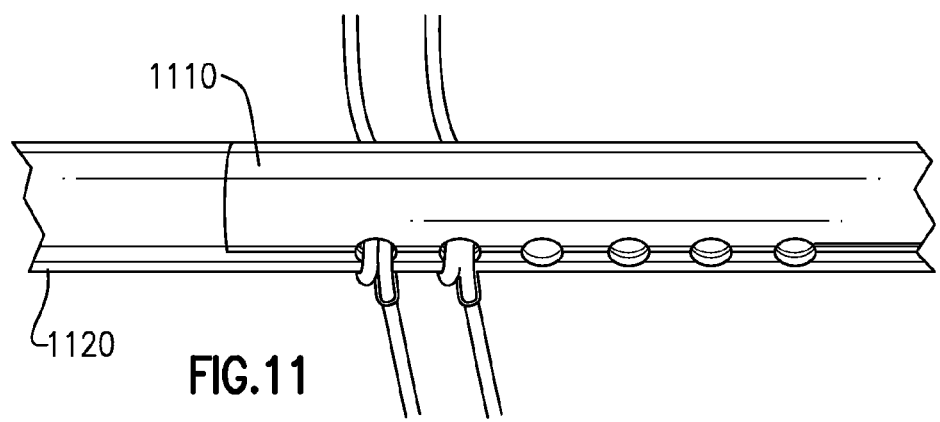
FIG. 11 depicts a bar with cables wrapped.

FIG. 11 shows two cables, wrapped with at least two turns, with the top half section 1110 connected bottom half section 1120 of the bar.

In another embodiment, the bar contains an individual half ferrite core at the channel. Application of adhesive or epoxy or molded receptacle of rubber/foam compound etc. affixed inside the half bar will serve as holder for the half cores and also apply a forward pressure to insure core halves closure to form an inductor. When the 2 halves of the bar are connected together then the ferrite core halves form an inductor around the cable(s) passing through the opening.

In the embodiment, the bar is attached and grounded at both sides of the frame. Multiple techniques for attaching and grounding the bar to the frame are described below. The techniques provide a list of examples and are not exhaustive.

Figure 12:
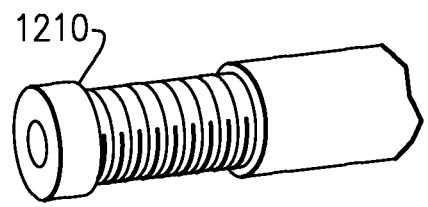
FIG. 12 depicts a threaded end cap.

In one embodiment, a threaded extendable end design may be used to attach and ground the bar to the sides of the frame. Such a threaded extendable end design makes use of a threaded cap 1210 as shown in FIG. 12.

Figure 13:
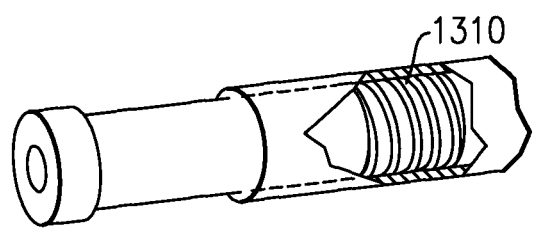
FIG. 13 depicts a threaded end cap.

A corresponding thread design 1310 inside the bar allows the threaded cap to be inserted into the bar and the cap may be extended or retracted with respect to the bar by twisting the end cap in a clockwise or counterclockwise fashion as depicted in FIG. 13.

Figure 14:
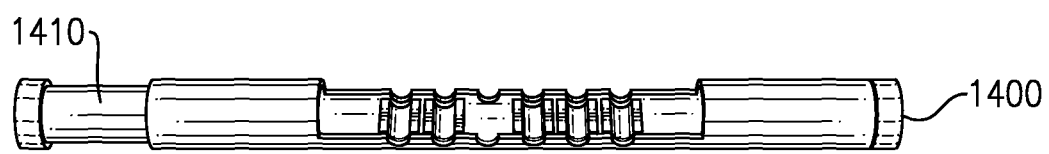
FIG. 14 depicts a bar with one end extended.

In such a way the length of the bar may be adjusted as well as the pressure exerted against the side walls. FIG. 14 shows a bar with one side extended as describe above. End section 1410 is extended to lengthen the bar 1400.

In another embodiment, conductive magnetic end caps also can be used as fastening mechanism to the frame side walls, whereby magnets at the end caps magnetically attach the bar to the electronics rack. The bar may incorporate an extendable section tension adjustment, for example, under spring load with, regardless of the grounding/attachment mechanism used.

Figure 15:
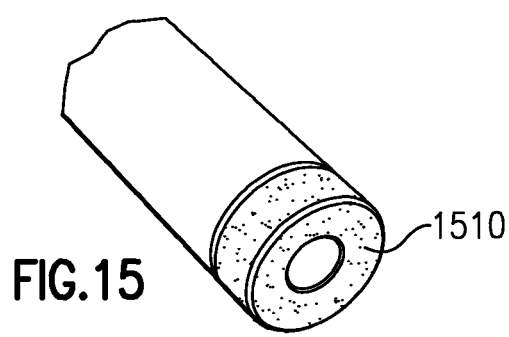
FIG. 15 depicts a metallic foam lined end cap.

The grounding contacts may utilize a metallic impregnated rubber compound or similar conductive elastomer. For example, a silver or copper metal containing elastomer may be used. A foam lined metallic cloth may also be used to provide a grounding contact and assist in ensuring a tight fit since the foam would compress under pressure as shown in FIG. 15. 1510 depicts the foam lined metallic cloth covering a grounding contact at one end of the bar.

The bar with the ferrite cores serves dual functions: cable retention as well as RF chokes when the I/O cables are wound inside the ferrite cores. The bar also serves additional function to change the frame's or I/O chassis' resonant frequencies for additional EMI suppression since it will distort the nearby electromagnetic field emission from the I/O drawers. The bar is applicable to any I/O drawer that resides in a system.

We claim:

1. A device for cable support and electromagnetic interference (EMI) reduction in an electronics rack, the device comprising:
   a cable support bar having at least one opening for at least one cable of the electronics rack to pass therethrough, the cable support bar having a first end and a second end and formed by joining a top section half and a bottom section half, the rack having a first side wall and a second side wall;
   the top section half of the bar having at least one top channel and the bottom section half of the bar having at least one bottom channel, wherein ferrite inductor portions are dispersed within and around the at least one top channel and the at least one bottom channel;
   a first attachment mechanism to attach and ground the first end of the bar to the first side of the rack; and
   a second attachment mechanism to attach and ground the second end of the bar to the second side of the rack;
   wherein:
      the top and bottom section halves of the bar are disposed so that when the top section is attached to the bottom section the top section and bottom section thereby form an attached structure with the channels aligned to create the opening through which the at least one cable may pass;
      the attached structure applies force to the ferrite inductor portions to ensure that the top ferrite inductor portion and the bottom ferrite inductor portion make physical contact thereby forming an electromagnetic inductor around a cable passing through the opening; and
      at least one attachment mechanism is spring loaded in order to apply pressure to a side wall.

2. The device of claim 1, wherein at least one half of the bar comprises a continuous section of ferrite material, the continuous section of ferrite material comprising a channel milled into the ferrite material.

3. The device of claim 1, wherein the at least one half comprises at least one individual half ferrite core located at the channel.

4. The device of claim 1 at least one attachment mechanism is a threaded extendable end design applying in order to apply pressure to a side wall.

5. The device of claim 1 wherein at least one attachment mechanism is a conductive magnetic end cap which magnetically attaches to a side wall.

6. The device of claim 1 wherein a grounding contact is made between an attachment mechanism and a side wall via conductive elastomer.

7. The device of claim 1 wherein a grounding contact is made between an attachment mechanism and the rack via foam lined conductive metallic cloth.

8. The device of claim 1, further comprising a conductive coating or plating over the cable support bar.

9. An electronics system comprising:
   an electronics rack, the electronics rack comprising:
      a rack frame;
      at least one electronics subsystem disposed within the electronics rack and supported by the rack frame; and
   a cable support and electromagnetic interference (EMI) reduction device attached to the electronics rack, the device comprising:
      a cable support bar having at least one opening for at least one cable of the electronics rack to pass therethrough, the cable support bar having a first end and a second end and formed by joining a top section half and a bottom section half, the rack having a first side wall and a second side wall;
      the top section half of the bar having at least one top channel and the bottom section half of the bar having at least one bottom channel, wherein ferrite inductor portions are dispersed within and around the at least one top channel and the at least one bottom channel;
      a first attachment mechanism to attach and ground the first end of the bar to the first side of the rack; and
      a second attachment mechanism to attach and ground the second end of the bar to the second side of the rack;
      wherein:
         the top and bottom section halves of the bar are so disposed so that when the top section is attached to the bottom section the top section and bottom section thereby form an attached structure;
         the channels align to create the opening through which the at least one cable may pass;
         the attached structure applies force to the ferrite inductor portions to ensure that the top ferrite inductor portion and the bottom ferrite inductor portion make physical contact thereby forming an electromagnetic inductor around a cable passing through the opening; and
         at least one attachment mechanism is spring loaded in order to apply pressure to a side wall.

10. The system of claim 9, wherein at least one half of the bar comprises a continuous section of ferrite material, the continuous section of ferrite material comprising a channel milled into the ferrite material.

11. The system of claim 9, wherein at least one half comprises at least one individual half ferrite core half at the channel.

12. The system of claim 9 at least one attachment mechanism is a threaded extendable end design applying in order to apply pressure to a side wall.

13. The system of claim 9 wherein at least one attachment mechanism is a conductive magnetic end cap which magnetically attaches to a side wall.

14. The system of claim 9 wherein a grounding contact is made between an attachment mechanism and a side wall via conductive elastomer.

15. The system of claim 9 wherein a grounding contact is made between an attachment mechanism and the rack via foam lined conductive metallic cloth.

16. The system of claim 9, further comprising a conductive coating or plating over the cable support bar.

17. A method of supporting and attenuating electromagnetic interference on at least one input/output cable exiting an electronics rack, the method comprising:
   providing a cable support and electromagnetic interference (EMI) reduction bar for the electronics rack, the bar having at least one opening for at least one cable of the electronics rack to pass therethrough;
   the cable support bar having a first end and a second end and formed by joining a top section half and a bottom section half, the rack having a first side wall and a second side wall;

the top section half of the bar having at least one top channel and the bottom section half of the bar having at least one bottom channel; and providing ferrite inductor portions around the at least one top channel and the at least one bottom channel;

wherein:
- the top and bottom section halves of the bar are so disposed so that when the top section is attached to the bottom section, the top section and bottom section thereby form an attached structure;
- the channels align to create the opening through which the at least one cable may pass;
- the attached structure applies force to the ferrite inductor portions to ensure that the top ferrite inductor portion and the bottom ferrite inductor portion make physical contact thereby forming an electromagnetic inductor around a cable passing through the opening; and
- at least one attachment mechanism is spring loaded in order to apply pressure to a side wall.

* * * * *